United States Patent
Choi

(10) Patent No.: US 8,263,985 B2
(45) Date of Patent: Sep. 11, 2012

(54) SEMICONDUCTOR LIGHT EMITTING DEVICE HAVING ONE OR MORE RECESSES ON A LAYER

(75) Inventor: Sung Min Choi, Suwon-si (KR)

(73) Assignee: LG Innotek Co., Ltd., Seoul (KR)

( * ) Notice: Subject to any disclaimer, the term of this patent is extended or adjusted under 35 U.S.C. 154(b) by 96 days.

(21) Appl. No.: 12/428,868

(22) Filed: Apr. 23, 2009

(65) Prior Publication Data

US 2009/0267098 A1 Oct. 29, 2009

(30) Foreign Application Priority Data

Apr. 24, 2008 (KR) .................. 10-2008-0038116

(51) Int. Cl.
*H01L 27/15* (2006.01)
(52) U.S. Cl. ............... 257/79; 257/13; 257/14; 257/87; 257/98; 432/22
(58) Field of Classification Search ............. 257/79, 257/98, 13, 14, 87; 438/22
See application file for complete search history.

(56) References Cited

U.S. PATENT DOCUMENTS

| 2004/0041156 | A1 | 3/2004 | Tsuda et al. |
| 2004/0232436 | A1* | 11/2004 | Tasi et al. ............ 257/103 |
| 2007/0057248 | A1* | 3/2007 | Yao et al. ............ 257/13 |
| 2007/0057249 | A1* | 3/2007 | Kim et al. ............ 257/14 |

FOREIGN PATENT DOCUMENTS

| JP | 2002-246694 A | | 8/2002 |
| JP | 2006-210824 A | | 8/2006 |
| JP | 2008-091608 | * | 4/2008 |
| JP | 2008-91608 A | | 4/2008 |
| KR | 10-2007-0088145 A | | 8/2007 |

* cited by examiner

*Primary Examiner* — A. Sefer
*Assistant Examiner* — Farid Khan
(74) *Attorney, Agent, or Firm* — Birch, Stewart, Kolasch & Birch, LLP

(57) ABSTRACT

Disclosed is a semiconductor light emitting device. The semiconductor light emitting device comprises a first conductive semiconductor layer, an active layer on the first conductive semiconductor layer, and a second conductive semiconductor layer comprising a plurality of recesses on the active layer.

12 Claims, 13 Drawing Sheets

US 8,263,985 B2

1

SEMICONDUCTOR LIGHT EMITTING DEVICE HAVING ONE OR MORE RECESSES ON A LAYER

The present application claims priority under 35 U.S.C. 126 to Korean Patent Application No. 10-2008-0038116 (filed on Apr. 24, 2008), which is hereby incorporated by reference in its entirety.

BACKGROUND

The present disclosure relates to a semiconductor light emitting device.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a semiconductor light emitting device comprising a compound semiconductor layer provided therein with recesses.

The embodiment provides a semiconductor light emitting device comprising a plurality of compound semiconductor layers provided at a threading dislocation region thereof with a recess.

The embodiment provides a semiconductor light emitting device comprising a compound semiconductor layer and a recess corresponding to a threading dislocation of an electrode layer.

An embodiment provides a semiconductor light emitting device comprising: a first conductive semiconductor layer, an active layer on the first conductive semiconductor layer, and a second conductive semiconductor layer comprising a plurality of recesses on the active layer.

An embodiment provides a semiconductor light emitting device comprising: a substrate comprising a plurality of convex patterns, a light emitting structure comprising a plurality of compound semiconductor layers on the substrate, an electrode layer on the light emitting structure, and a recess formed from the electrode layer to a predetermined position of the light emitting structure corresponding to the convex pattern of the substrate.

An embodiment provides a semiconductor light emitting device comprising: a light emitting structure having a threading dislocation and comprising a first conductive semiconductor layer, an active layer on the first conductive semiconductor layer, and a second conductive semiconductor layer on the active layer, an electrode layer on the light emitting structure, and a plurality of recesses formed from the electrode layer to a predetermined depth of the light emitting structure corresponding to the threading dislocation.

2

Figure 13:
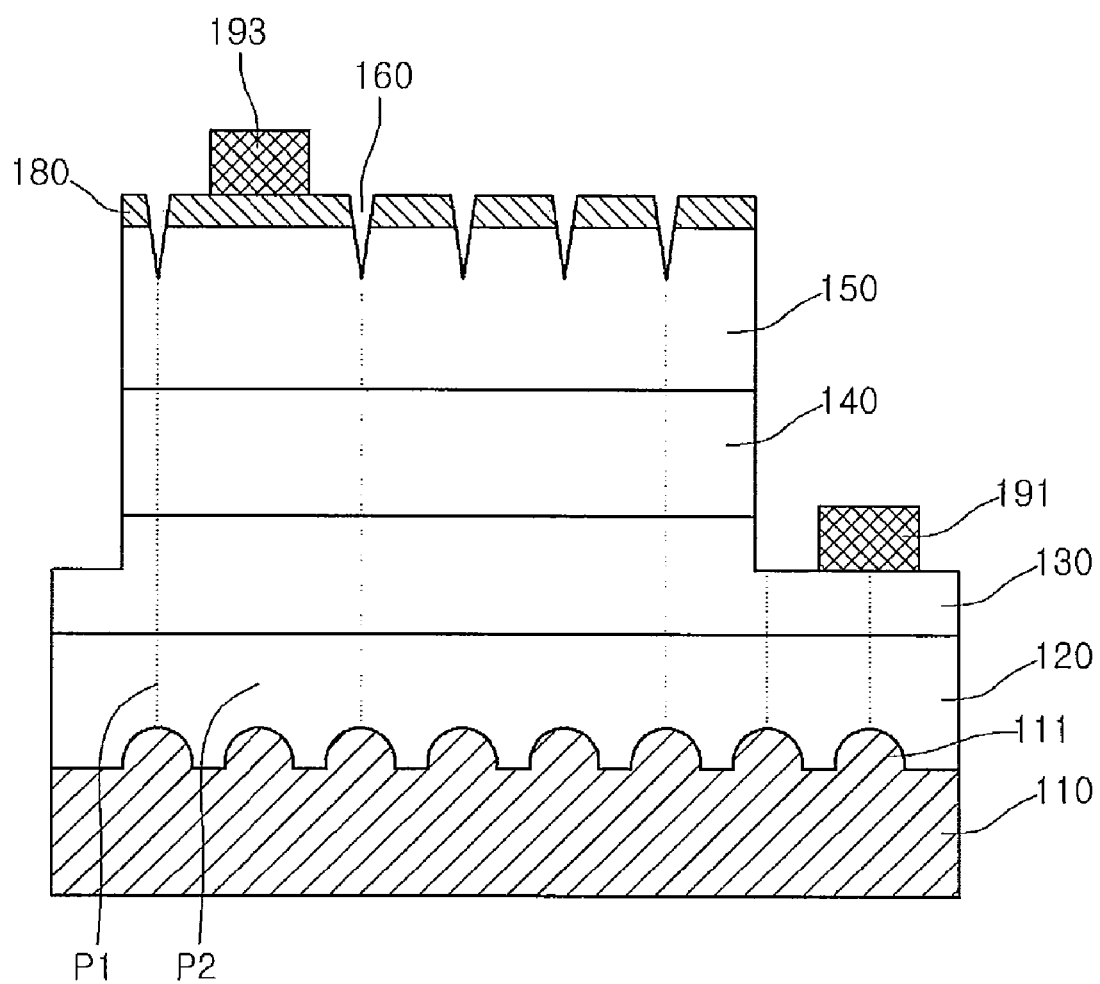
Figure 14:
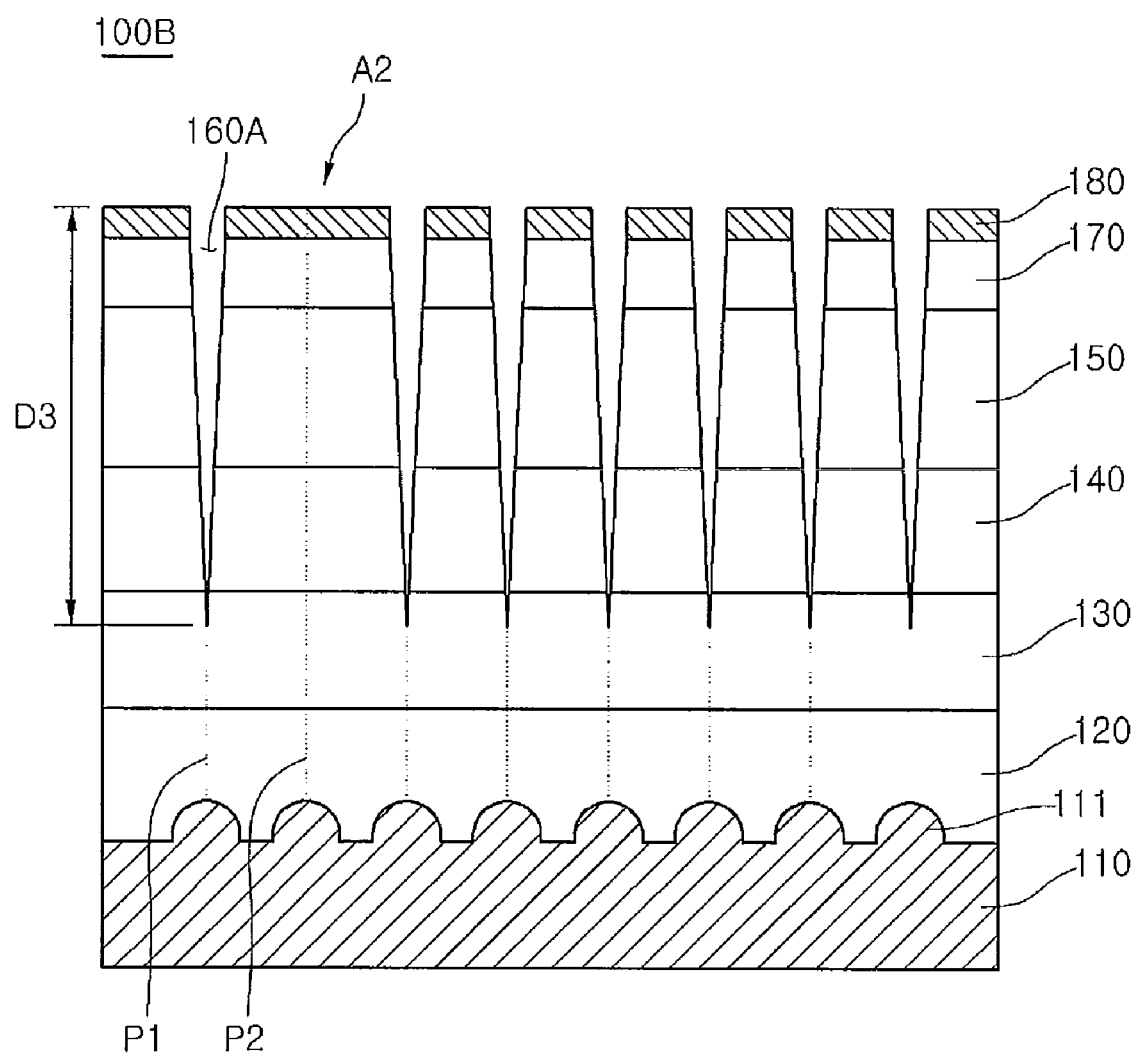
Figure 15:
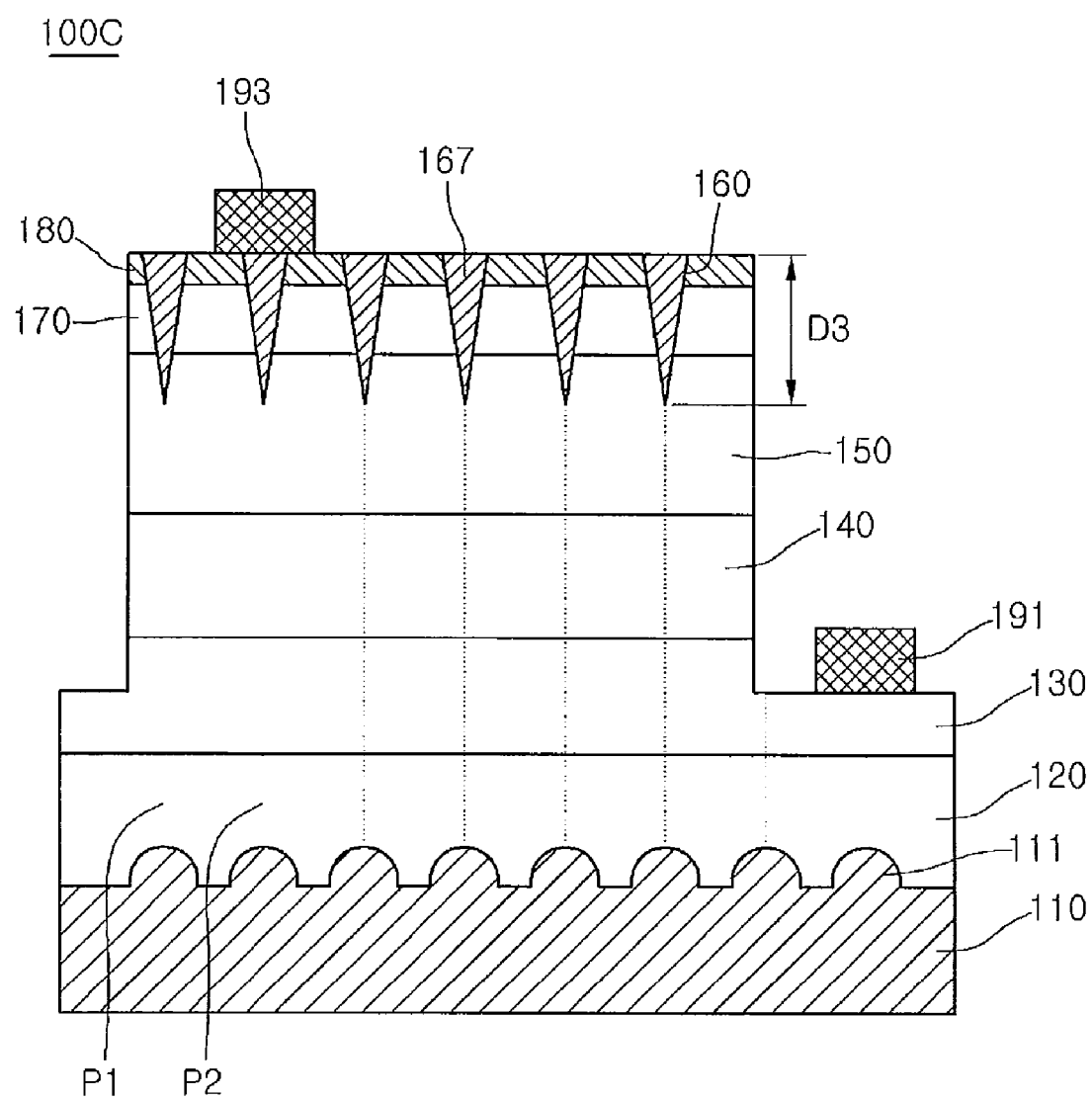
Figure 16:
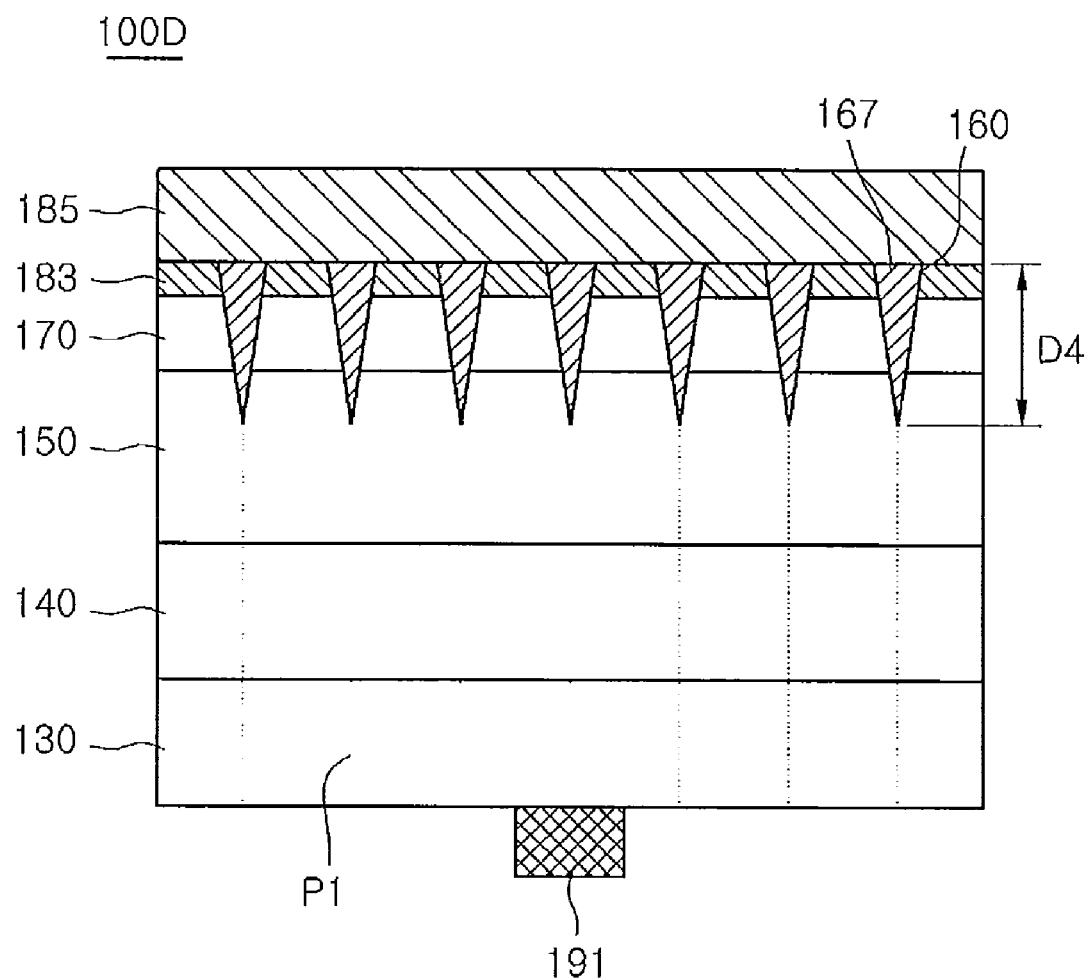

FIGS. 2 to 12 are views showing a method for manufacturing the semiconductor light emitting device according to the first embodiment;

FIG. 13 is a side sectional view showing a semiconductor light emitting device according to a second embodiment;

FIG. 14 is a side sectional view showing a semiconductor light emitting device according to a third embodiment;

FIG. 15 is a side sectional view showing a semiconductor light emitting device according to a fourth embodiment; and FIG. 16 is a side sectional view showing a semiconductor light emitting device according to a fifth embodiment.

DETAILED DESCRIPTION OF THE EMBODIMENTS

Hereinafter, a semiconductor light emitting device according to the embodiment will be described with reference to accompanying drawings. In the description about the embodiment, the size of components shown in the accompanying drawings is for an illustrative purpose only, but the embodiment is not limited thereto.

Figure 1:
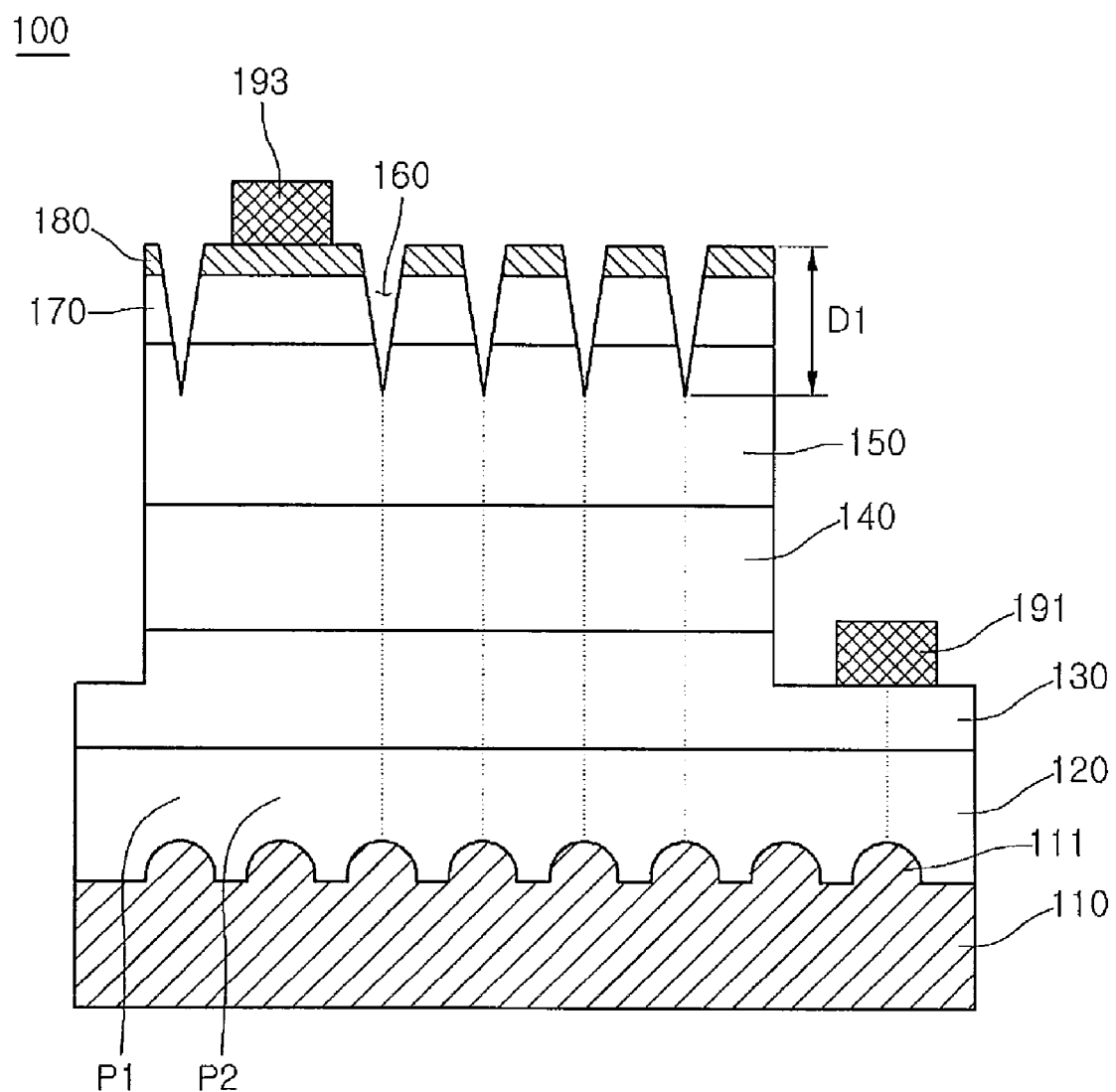
FIG. 1 is a side sectional view showing a semiconductor light emitting device according to a first embodiment.

FIG. 1 is a side sectional view showing a semiconductor light emitting device according to a first embodiment.

Referring to FIG. 1, the semiconductor light emitting device 100 comprises a substrate 110, an undoped semiconductor layer 120, a first conductive semiconductor layer 130, an active layer 140, a second conductive semiconductor layer 150, a plurality of recesses 160, a third conductive semiconductor layer 170, an electrode layer 180, a first electrode 191, and a second electrode 193.

The semiconductor light emitting device 100 comprises a light emitting diode (LED) based on group III-V compound semiconductors, and the LED may comprise a color LED emitting blue light, green light or red light or an UV LED. The light emitted from the LED may be variously realized within the technical scope of the embodiment.

The substrate 110 may comprise one selected from the group consisting of aluminum oxide ($Al_2O_3$), gallium nitride (GaN), silicon carbide (SiC), zinc oxide (ZnO), silicon (Si), gallium phosphide (GaP), and gallium arsenide (GaAs). A convex pattern 111 is formed on an upper surface of the substrate 110. The convex pattern 111 may have a lens shape or a hemispherical shape to improve external quantum efficiency. The material and the pattern shape of the substrate 110 may be variously changed within the technical scope of the embodiment, but the embodiment is not limited thereto.

A buffer layer (not shown) is formed on the substrate 110, and the buffer layer reduces a lattice constant between the substrate 110 and a GaN semiconductor. The buffer layer may comprise a group III-V compound semiconductor such as gallium nitride (GaN), aluminum nitride (AlN), aluminum gallium nitride (AlGaN), indium gallium nitride (InGaN), indium nitride (InN), indium aluminum gallium nitride (InAlGaN), or aluminum indium nitride (AlInN).

The undoped semiconductor layer 120 may be formed on the substrate 110 or the buffer layer. The undoped semiconductor layer 120 may comprise a GaN-based semiconductor. At least one of the buffer layer and the undoped semiconductor layer 120 may be formed on the substrate 110, or no layer may be formed on the semiconductor substrate 110.

At least one first conductive semiconductor layer 130 is formed on the undoped semiconductor layer 120. The first conductive semiconductor layer 130 comprises a group III-V compound semiconductor doped with the first conductive dopant. For example, the first conductive semiconductor layer 130 may one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN) that are semiconductor materials having a composition formula of $In_xAl_yGa_{1-x-y}N$ ($0 \leq x \leq 1$, $0 \leq y < 1$, $0 \leq x+y \leq 1$). When the first conductive semiconductor layer 130 is an N-type semiconductor layer, the first conductive dopant comprises an N-type dopant such as silicon (Si), germanium (Ge), tin (Sn), selenium (Se), or tellurium (Te). The first conductive semiconductor layer 130 may serve as an electrode contact layer, and the embodiment is not limited thereto.

The active layer 140 is formed on the first conductive semiconductor layer 130, and the active layer 140 may have a single quantum well structure or a multi-quantum well structure.

In the active layer 140, a quantum well layer and a quantum barrier layer may be periodically formed by using materials of group III-V compound semiconductors. For example, an InGaN quantum well layer/a GaN quantum barrier layer or an AlGaN quantum well layer/a GaN quantum barrier layer may be periodically formed. The active layer 140 may selectively comprise materials having band cap energy according to the wavelength of light. The active layer 140 may comprise a material emitting color light such as blue light, red light, or green light.

A conductive clad layer may be formed on and/or under the active layer 140, and may comprise an AlGaN-based semiconductor.

At least one second conductive semiconductor layer 150 is formed on the active layer 140. The second conductive semiconductor layer 150 may comprise group III-V compound semiconductors doped with a second conductive dopant. For example, the second conductive semiconductor layer 150 may comprise one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN) that are semiconductor materials having a composition formula of $In_xAl_yGa_{1-x-y}N$ ($0 \leq x \leq 1$, $0 \leq y \leq 1$, $0 \leq x+y \leq 1$). When the second conductive semiconductor layer 150 is a P-type semiconductor layer, the second type dopant comprises a P-type dopant such as Mg or Ze.

The third conductive semiconductor layer 170 is formed on the second conductive semiconductor layer 150. The third conductive semiconductor layer 170 may comprise group III-V compound semiconductors doped with the first conductive dopant. For example, the third conductive semiconductor layer 170 may comprise one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), or aluminum indium nitride (AlInN) that are semiconductor materials having a composition formula of InxAlyGa1−x−yN ($0 \leq x \leq 1$, $0 \leq y \leq 1$, $0 \leq x+y \leq 1$). When the third conductive semiconductor layer 170 is an N-type semiconductor layer, the first type dopant comprises an N-type dopant such as silicon (Si), germanium (Ge), tin (Sn), selenium (Se), or tellurium (Te). The first conductive semiconductor layer 170 can serve as an electrode contact layer, but the embodiment is not limited thereto.

The first conductive semiconductor layer 130, the active layer 140, the second conductive semiconductor layer 150, and the third conductive semiconductor layer 170 may be defined as a light emitting structure. The first conductive semiconductor layer 130, the second conductive semiconductor layer 150, and the third conductive semiconductor layer 170 may be formed as a P-type semiconductor, an N-type semiconductor, and a P-type semiconductor, respectively. The light emitting structure may comprise at least one of an N—P—N junction structure, a P—N—P junction structure, an N—P junction structure, and a P—N junction structure.

The electrode layer 180 is formed on the light emitting structure. The electrode layer 180 may be formed on the third conductive semiconductor layer 170 using a transmissive electrode material. The electrode layer 180 comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO, but the embodiment is not limited thereto.

The first electrode 191 may be formed in a predetermined region of the first conductive semiconductor layer 130, and the second electrode 193 may be formed on the electrode layer 180. The second electrode 193 may directly/indirectly make contact with the electrode layer 180 and/or the third conductive semiconductor layer 170, but the embodiment is not limited thereto.

The semiconductor light emitting device 100 may have a crystal defect occurring to the surface of the electrode layer 180. The crystal defect has the form of dislocations (i.e., threading dislocations P1 and P2) vertically propagating from the convex pattern 111 of the substrate 110. The threading dislocations P1 and P2 are generated from the convex pattern 111 of the substrate 110 and pass through the plural compound semiconductor layers 120, 130, 140, 150, and 170. Such threading dislocations P1 and P2 may be used as a current path of a leakage current. If a high voltage such as electrostatic discharge (ESD) is applied to the semiconductor light emitting device 100, the high voltage may flow along the threading dislocations P1 and P2. In this case, the active layer 140 may be broken, and optical power can be reduced.

The recesses 160 are formed in the region of the threading dislocation P1 away from an upper layer of the semiconductor light emitting device 100 by a predetermined depth D1. Accordingly, the threading dislocation P1 is not exposed to the surface of the semiconductor light emitting device 100. In this case, the recess 160 may not be formed under the second electrode 193, thereby preventing the threading dislocation P2 from directly making contact with the electrode layer 180.

The depth D1 of the recess 160 may be made from the electrode layer 180 to an upper portion of the second conductive semiconductor layer 150 through the third conductive semiconductor layer 170. Each recess 160 corresponds to the threading dislocation P1. In this case, the recess 160 is formed to the electrode layer 180 or to the third conductive semiconductor layer 170 to remove the threading dislocation P1.

The recess 160 may be formed to the depth D1 corresponding to the convex pattern 111 of the substrate 110.

The electrode layer 180 may not be formed. In this case, the recess 160 may be formed to a predetermined depth from the third conductive semiconductor layer 170.

The recess 160 may have at least one of a polyhedral shape, a reverse conical shape, a polygonal column shape, a cylindrical shape, and a hemispherical shape. The recess 160 may have the maximum width or the maximum diameter of about 10 nm to about 3000 nm and the depth D1 of about 10 nm to about 1000 nm. The width of the recess 160 may be changed according to the size of the convex pattern 111 of the substrate 110. The recess 160 may have a size based on the light intensity and the light emitting area of the semiconductor light emitting device 100.

The recess 160 is formed corresponding to the position of the threading dislocation P1 or the convex pattern 111 of the substrate 110 to improve low current and ESD characteristics of the semiconductor light emitting device 100 and increase light extraction efficiency, so that the reliability of the semiconductor light emitting device 100 can be improved.

FIGS. 2 to 12 are views showing a method for manufacturing the semiconductor light emitting device according to the first embodiment.

Figure 2:
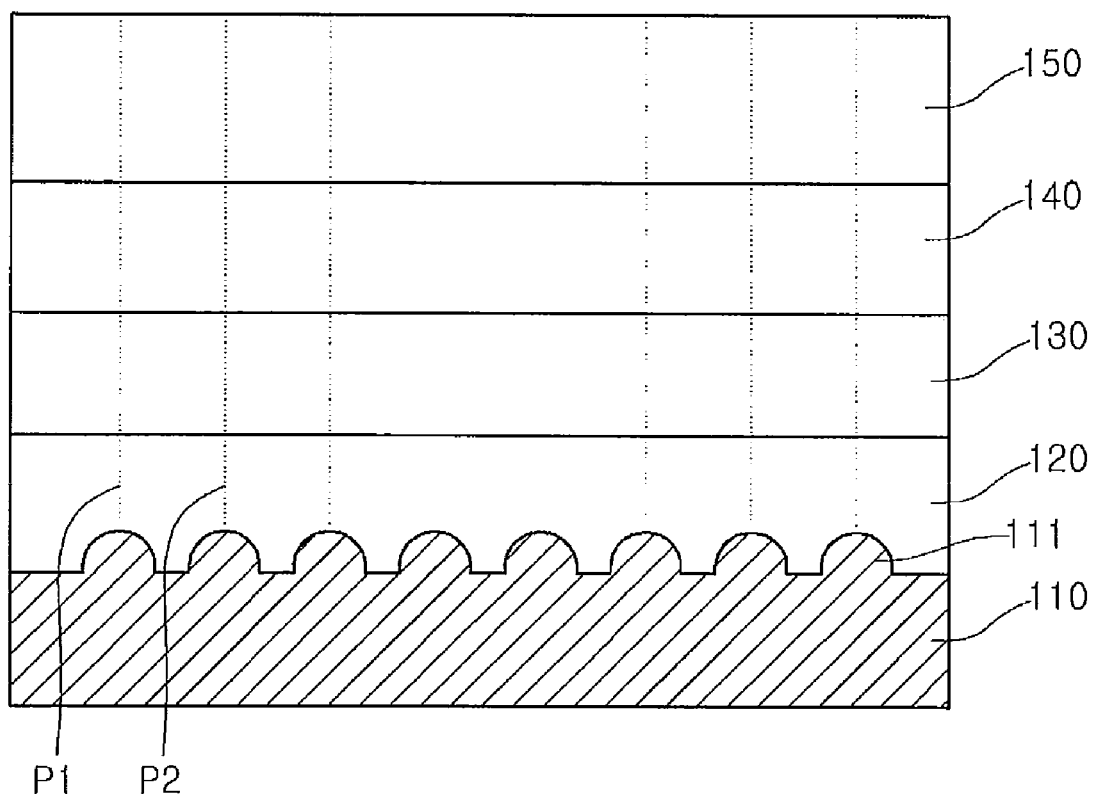

Referring to FIG. 2, the plurality of compound semiconductor layers 120, 130, 140, and 150 are formed on the substrate 110.

The substrate 110 may comprise one selected from the group consisting of aluminum oxide ($Al_2O_3$), gallium nitride (GaN), silicon carbide (SiC), zinc oxide (ZnO), silicon (Si), gallium phosphide (GaP), and gallium arsenide (GaAs).

Figure 3:
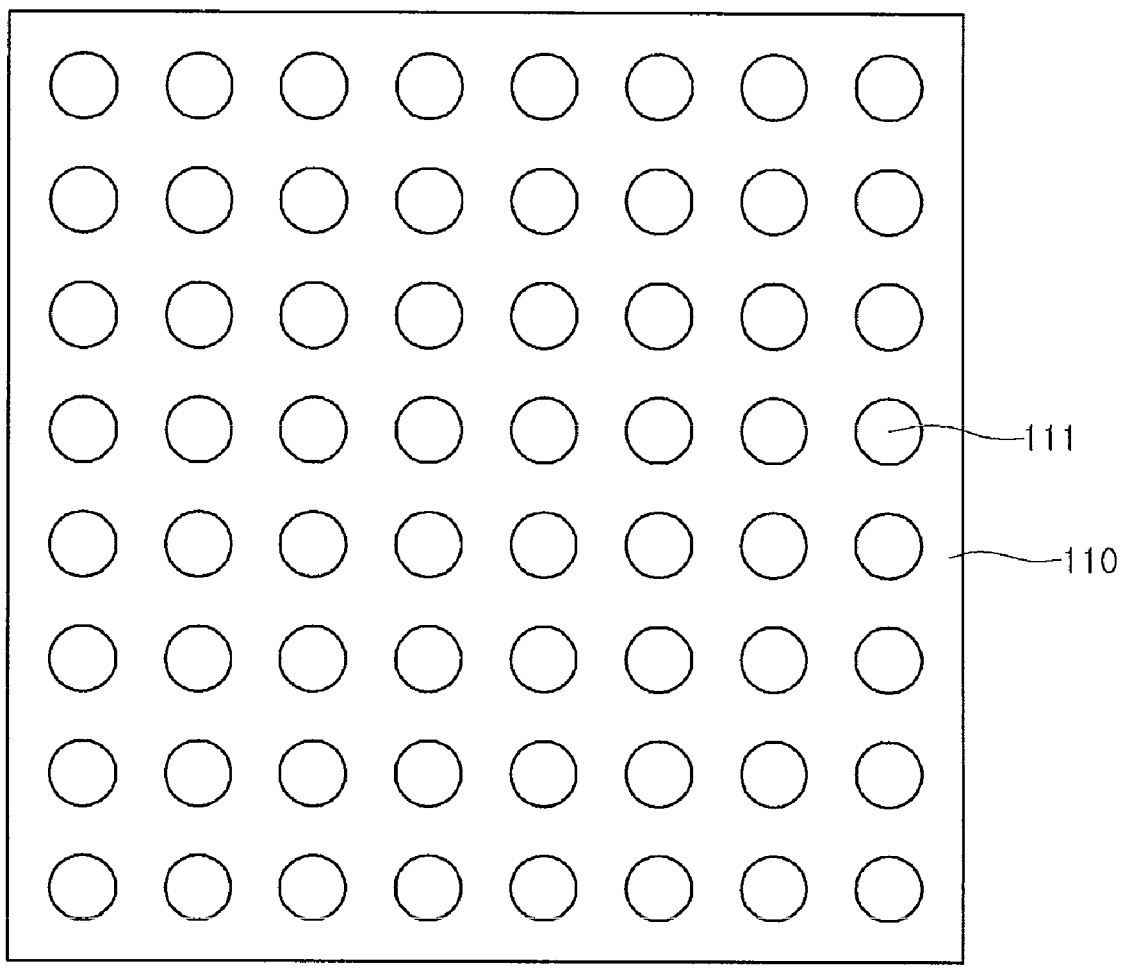

As shown in FIGS. 2 and 3, a plurality of convex patterns 111 are formed on the substrate 110 with a uniform interval, and protrude in a convex lens shape or a hemispherical shape. The convex patterns 111 may be integrally formed with the substrate 110, or may be independently formed on the substrate 110 by using a different material.

Figure 4:
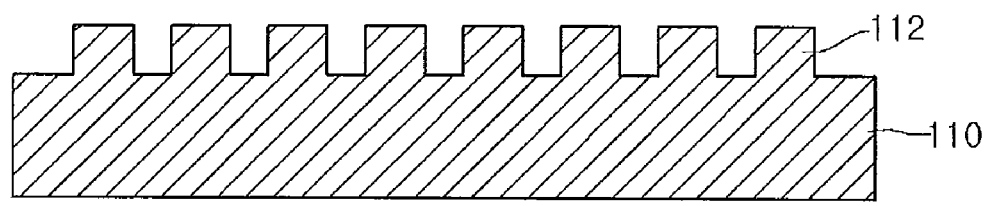

FIG. 4 is a view showing a convex pattern 112 of the substrate 111 having a shape different from that of the convex patterns 111 shown in FIG. 3.

Referring to FIG. 4, the convex pattern 112 of the substrate 110 may have a rectangular shape. The convex pattern 112 may have a polyhedral shape having a predetermined size arranged in the form of a matrix or a stripe, but the embodiment is not limited thereto.

A nitride semiconductor is grown from the substrate 110, and growing equipment comprises an electron beam, an evaporator, and a dual-type thermal evaporator. The nitride semiconductor may be grown through a physical vapor deposition (PVD), a chemical vapor deposition (CVD), a plasma laser deposition (PLD), a sputtering scheme, or a metal organic chemical vapor deposition (MOCVD).

The undoped semiconductor layer 120 is formed on the substrate 110. The undoped semiconductor layer 120 may comprise an AlGaN-based semiconductor that is not doped with a conductive dopant. Another semiconductor layer, for example, a buffer layer (not shown) may be formed between the substrate 110 and the undoped semiconductor layer 120. The buffer layer may be one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN). However, the embodiment is not limited to the semiconductor layer existing between the substrate 110 and the first conductive semiconductor layer 130.

The first conductive semiconductor layer 130, the active layer 140, and the second conductive semiconductor layer 150 may be sequentially formed on the undoped semiconductor layer 120. Another layer may be formed among the layers, but the embodiment is not limited thereto.

The first conductive semiconductor layer 130 comprises group III-V compound semiconductors doped with the first conductive dopant. For example, the first conductive semiconductor layer 130 may comprise one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN) that are semiconductor materials having a composition formula of $In_xAl_yGa_{1-x-y}N$ ($0 \leq x \leq 1$, $0 \leq y \leq 1$, $0 \leq x+y \leq 1$). When the first conductive semiconductor layer 130 is an N-type semiconductor layer, the first conductive dopant comprises an N-type dopant such as silicon (Si), germanium (Ge), tin (Sn), selenium (Se), or tellurium (Te).

The active layer 140 may comprise a semiconductor material having a composition formula of $In_xAl_yGa_{1-x-y}N$ ($0 \leq x \leq 1$, $0 \leq y \leq 1$, $0 \leq x+y \leq 1$), and may have a single quantum well structure or a multi-quantum well structure. The active layer 140 may comprise a material emitting color light such as blue light, red light, or green light, but the embodiment is not limited thereto. A conductive clad layer may be formed on and/or under the active layer 140, and the conductive clad layer may comprise an AlGaN-based semiconductor.

The second conductive semiconductor layer 150 may comprise group III-V compound semiconductors doped with the second conductive dopant. For example, the second conductive semiconductor layer may comprise one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), or aluminum indium nitride (AlInN) that are semiconductor materials having a composition formula of $In_xAl_yGa_{1-x-y}N$ ($0 \leq x \leq 1$, $0 \leq y \leq 1$, $0 \leq x+y \leq 1$). When the second conductive semiconductor layer 150 is a P-type semiconductor layer, the second conductive dopant comprises a P-type dopant such as Mg or Ze.

Figure 5:
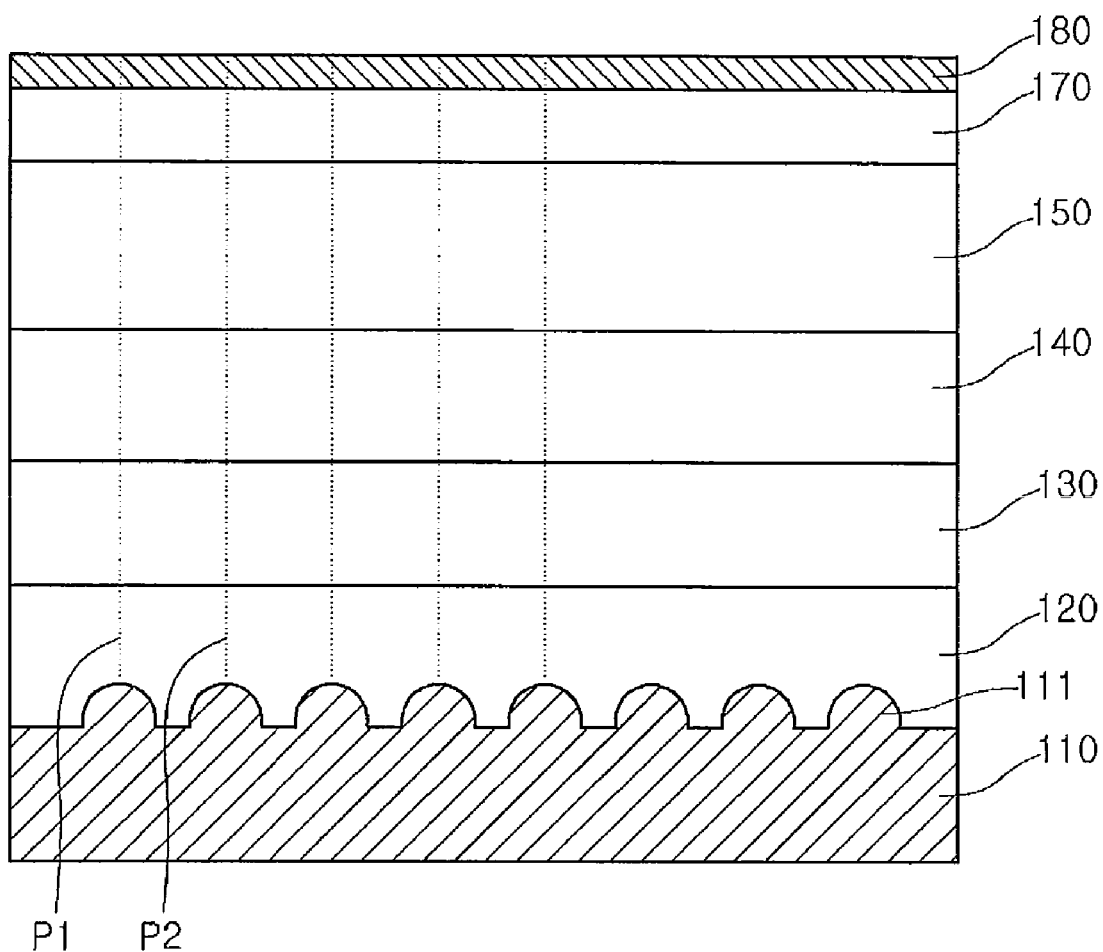

Referring to FIG. 5, the third conductive semiconductor layer 170 may be formed on the second conductive semiconductor layer 150, and the electrode layer 180 may be formed on the third conductive semiconductor layer 170.

The third conductive semiconductor layer 170 comprises group III-V compound semiconductors doped with the first conductive dopant. For example, the third conductive semiconductor layer 130 may comprise one selected from the group consisting of gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN) that are semiconductor materials having a composition formula of $In_xAl_yGa_{1-x-y}N$ ($0 \leq x \leq 1$, $0 \leq y \leq 1$, $0 \leq x+y \leq 1$). When the third conductive semiconductor layer 170 is an N-type semiconductor layer, the first conductive dopant comprises an N-type dopant such as silicon (Si), germanium (Ge), tin (Sn), selenium (Se), or tellurium (Te). The third conductive semiconductor layer 170 may serve as an electrode contact layer, but the embodiment is not limited thereto.

The first conductive semiconductor layer 130, the active layer 140, the second conductive semiconductor layer 150, and the third conductive semiconductor layer 170 may be defined as a light emitting structure. The first conductive semiconductor layer 130, the second conductive semiconductor layer 150, and the third conductive semiconductor layer 170 may be formed as a P-type semiconductor, an N-type semiconductor, and a P-type semiconductor, respectively. The light emitting structure may comprise at least one of an N—P—N junction structure, a P—N—P junction structure, an N—P junction structure, and a P—N junction structure.

The electrode layer 180 is formed on the light emitting structure. The electrode layer 180 may be formed on the third conductive semiconductor layer 170 using a transmissive electrode material. The electrode layer 180 comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO, but the embodiment is not limited thereto. The electrode layer 180 may be realized by using a reflective electrode material (e.g., aluminum (Al)).

Referring to FIGS. 2 and 5, the threading dislocations P1 and P2 are formed at the positions of the convex patterns 111 of the substrate 110. The threading dislocations P1 and P2 are a crystal defect occurring in the undoped semiconductor layer 120 due to the convex patterns 111 of the substrate 110, and extend to the surface of the electrode layer 180 through the compound semiconductors 120 to 170. The threading dislocations P1 and P2 vertically pass through the active layer 140 perpendicularly to the active layer 140 to serve as a current path of a leakage current. For example, when a high voltage such as an ESD is instantaneously applied, the high voltage flows along the threading dislocations P1 and P2. In this case, the active layer 140 may be broken, and optical power may be degraded.

Figure 6:
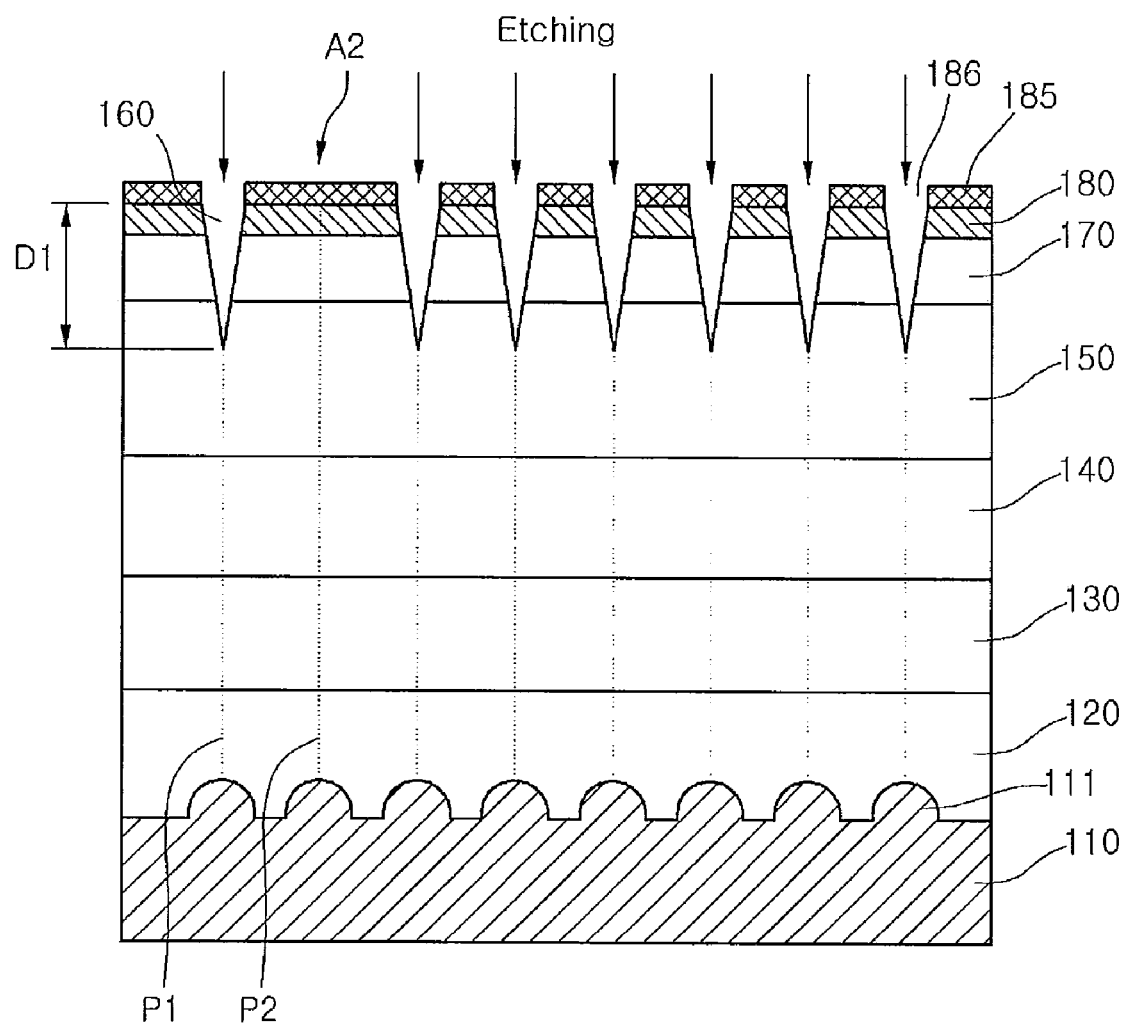

Referring to FIGS. 5 and 6, a mask pattern 185 is formed on the electrode layer 180. In order to form the mask pattern 185, a mask layer is prepared and a plurality of openings 186 are formed in the mask layer through a photo-mask process. The mask layer may comprise $SiO_2$, $SiO_x$, $SiN_x$, $SiO_xN_y$, or the like.

The openings 186 are formed corresponding to the convex patterns 111 of the substrate 110, but not formed in a region A2 for the second electrode 193. The openings 186 of the mask pattern 185 may not be formed through an additional process, but simultaneously formed when the recesses 160 are formed.

The recesses 160 having the depth D1 are formed using the openings 186 of the mask pattern 185. The recesses 160 may be formed through an etching process, for example, a dry etching (e.g., ICP) process and/or a wet etching process. The dry etching process may employ equipment for inductively coupled plasma (ICP), reactive ion etching (RIE), capacitively coupled plasma (CCP), or electron cyclotron resonance (ECR).

The recesses 160 formed in the electrode layer 180 are formed corresponding to the position of the convex patterns 111 of the substrate 110, thereby removing the threading dislocation P1 from the electrode layer 180.

The recesses 160 may be formed to the upper portion of the second conductive semiconductor layer 150 from the electrode layer 180 corresponding to the convex patterns 111 of the substrate 110. Accordingly, threading dislocations may be removed from the upper portion of the second conductive semiconductor layer 150, the third conductive semiconductor layer 170, and the electrode layer 180.

The recesses 160 may not be formed in a predetermined region of the electrode layer 180, for example, the region A2 for the second electrode. This is because the second electrode can be blocked to make contact with the threading dislocation P2 by the recesses 160, thereby preventing an ESD characteristic or a low current characteristic from being degraded.

Figure 7:
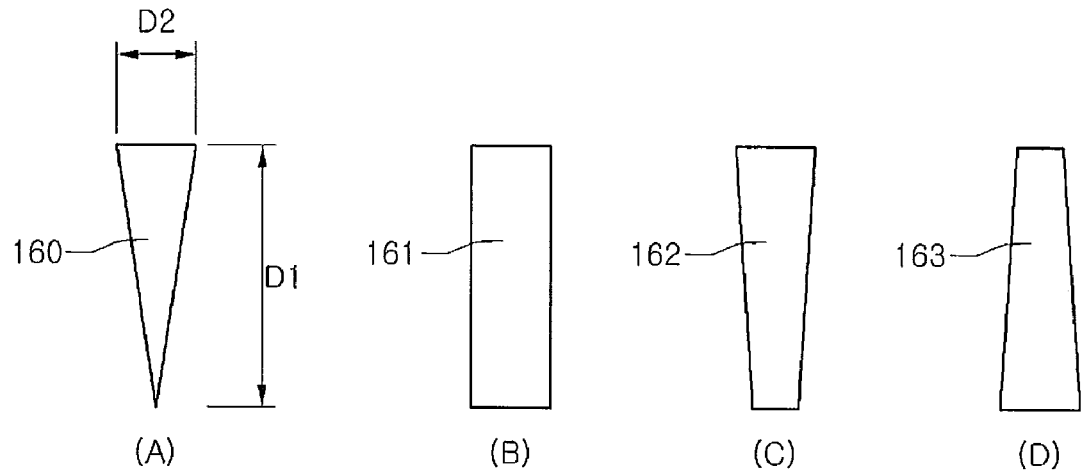

FIG. 7 is a side sectional view showing a recess shape according to the first embodiment.

Referring to FIGS. 7A to 7D, the reverse conical shape recess 160, a polyhedral recess 161, a trapezoidal shape recess 162, and a reverse trapezoid shape recess 163 may be formed. In addition, the recess shape comprises a polygonal column shape, a cylindrical shape, or a hemispherical shape, and may be changed in the technical scope of the embodiment.

As shown in FIG. 7A, the recess 160 has the maximum width D2 of about 10 nm to about 3000 nm, and the depth of about 10 nm to about 1000 nm. The maximum width D2 of the recess 160 may be changed according to the size of the convex pattern of the substrate, and the depth D1 may be changed according to the thickness of the compound semiconductor layers.

Figure 8:
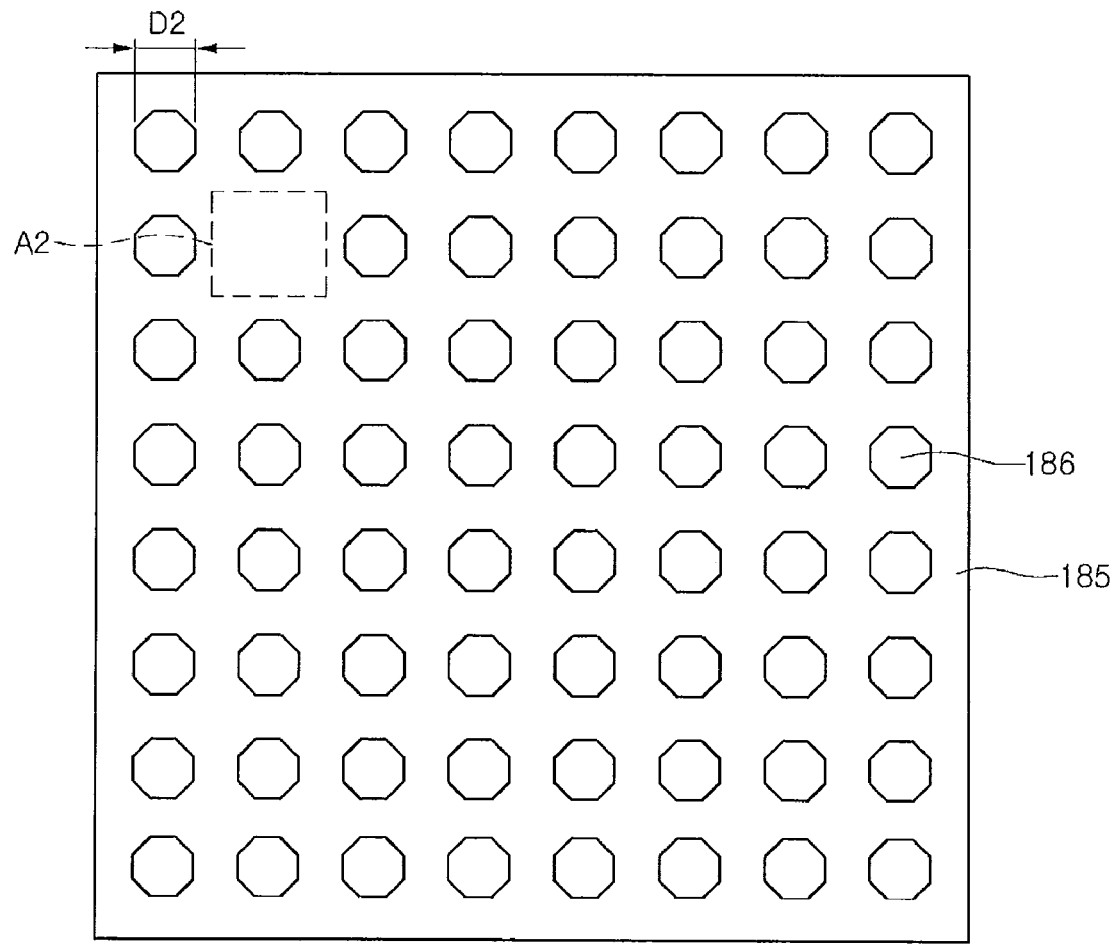

FIG. 8 is a view showing an opening shape of the mask pattern 185 according to the first embodiment.

Referring to FIG. 8, the openings 186 of the mask pattern 185 may have a polygonal shape (e.g., hexagonal shape). Accordingly, the surficial shape of the recesses may have a hexagonal shape. In this case, the openings 186 of the mask pattern 185 may have a polygonal shape beyond a triangular shape.

The openings 186 may have polygons arranged with a uniform interval or an irregular interval, and the width D2 of the openings 185 may be changed according to a chip size.

The openings 186 of the mask pattern 185 may not be formed in the region A2 for the second electrode.

Figure 9:
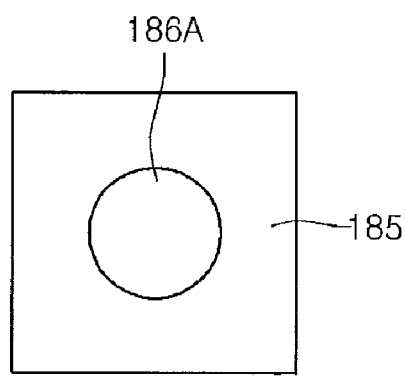

FIG. 9 is a view showing a modified opening shape of the mask pattern 185 according to the first embodiment.

Referring to FIG. 9, an opening 186A of the mask pattern 185 may have a circular shape. Accordingly, the surficial shape of the recesses may have a circular shape.

Figure 10:
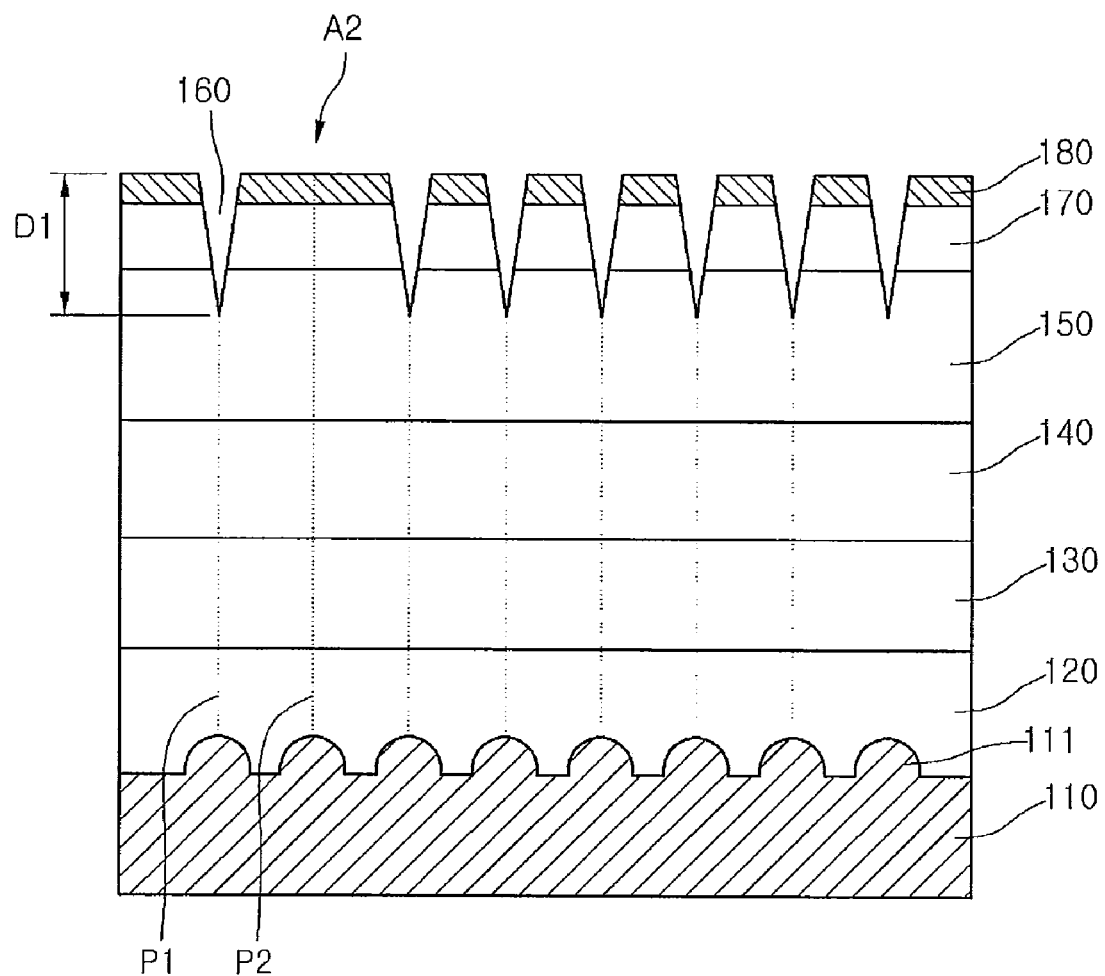

Referring to FIGS. 6 and 10, the mask pattern 185 is removed. The mask pattern 185 may be removed through a dry etching process, but the embodiment is not limited thereto.

Figure 11:
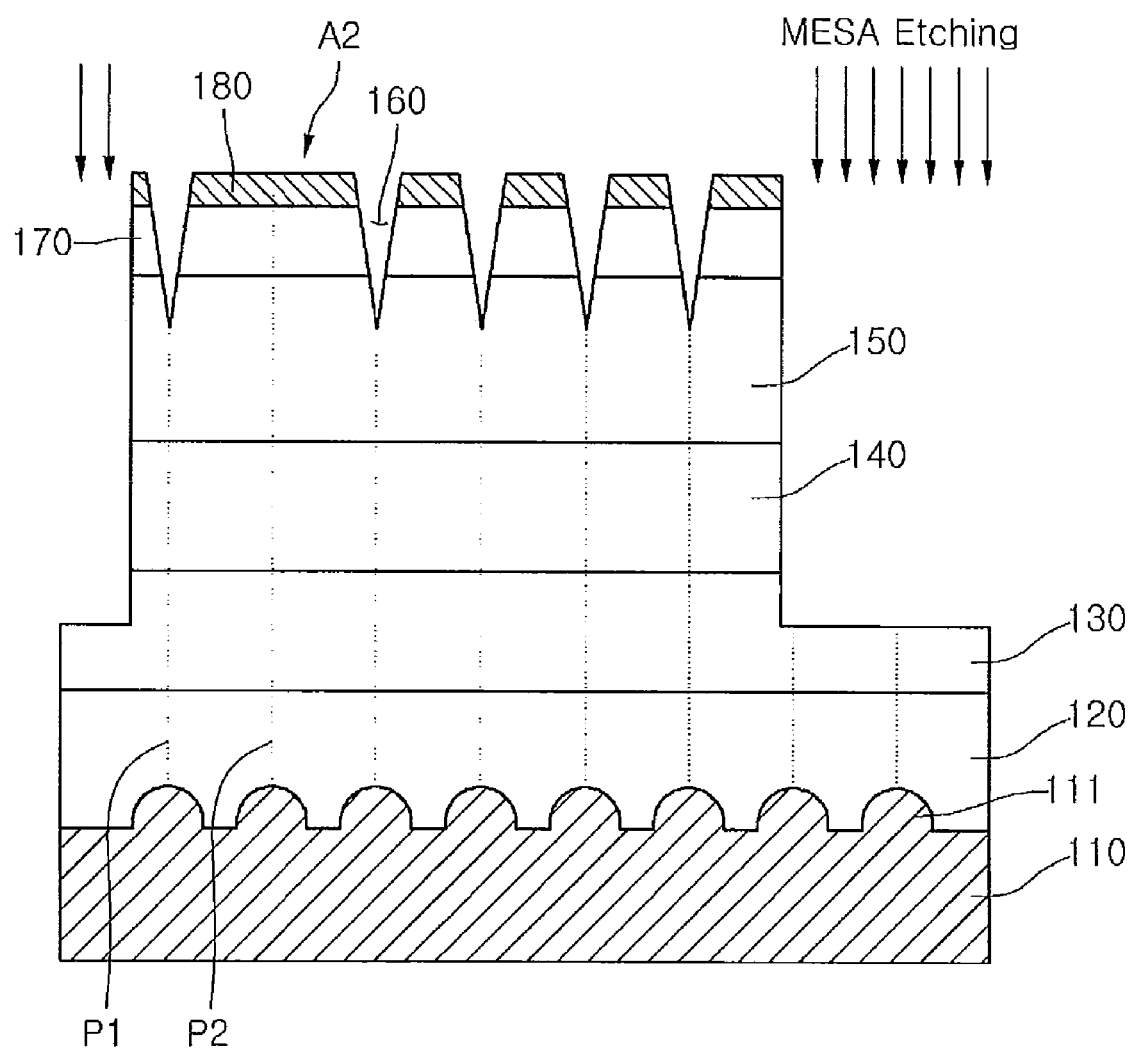

Referring to FIGS. 10 and 11, a predetermined region of the first conductive semiconductor layer 130 is exposed through a mesa etching process. In this case, the mesa etching process is performed from a portion of the electrode layer 180 to an upper portion of the first conductive semiconductor layer 130, thereby exposing the upper portion of the first conductive semiconductor layer 130. Such mesa etching process is to make boundaries between chips and expose a region for the first electrode.

Figure 12:
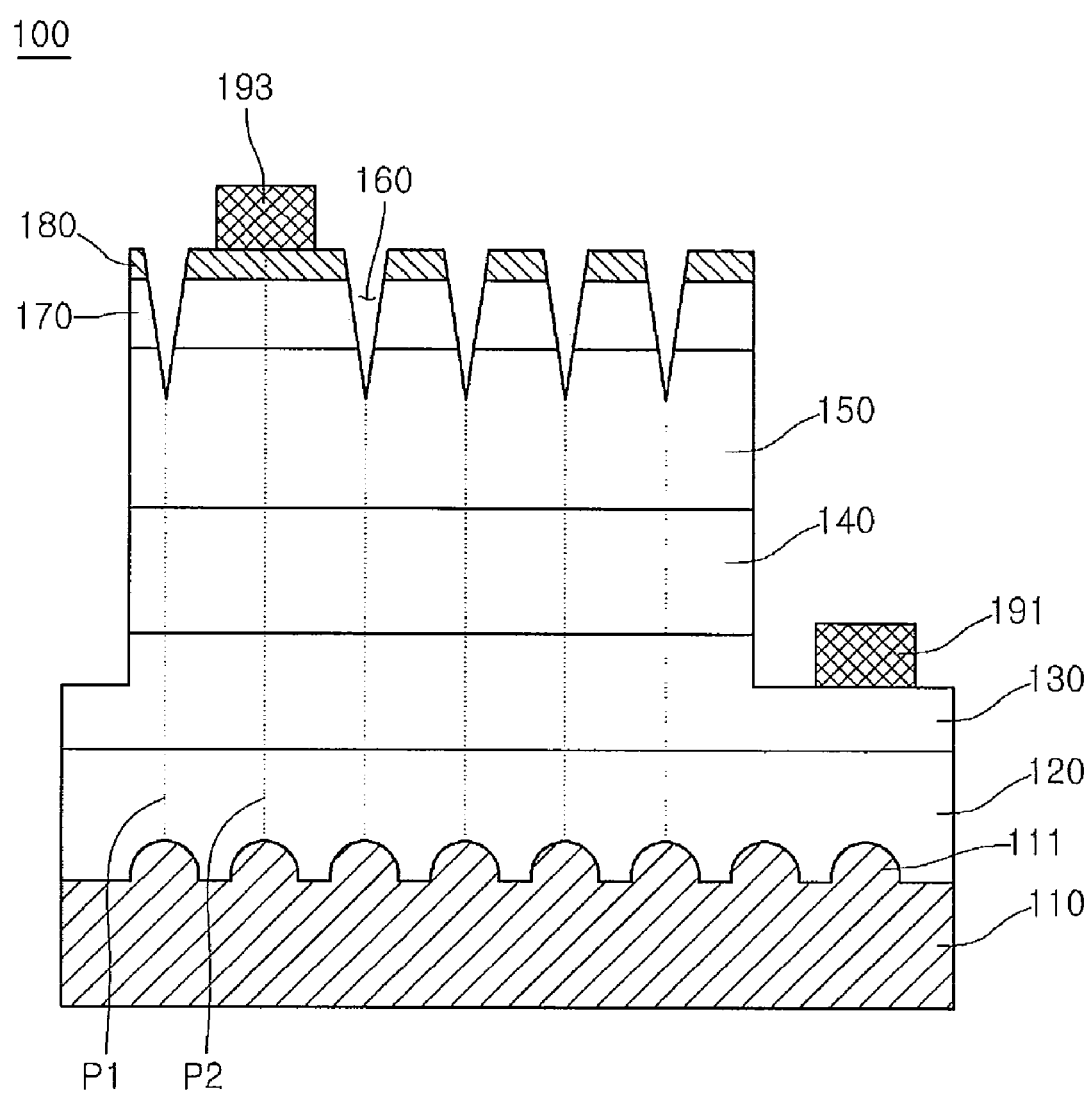

Referring to FIGS. 11 and 12, the first electrode 191 is formed on the first conductive semiconductor layer 130, and the second electrode 193 is formed in the region for the second electrode 193 on the electrode layer 180. The second electrode 193 may be formed on the electrode layer 180, or may be formed to make contact with the electrode layer 180 and the third conductive semiconductor layer 170.

The sequence of the etching process of forming the recess 160 and the mesa etching process may be changed, and the two etching processes may be simultaneously performed. However, the embodiment is not limited thereto.

The electrode layer 180 is provided on the upper surface of the third conductive semiconductor layer 170 to diffuse a current applied to the second electrode 193. The current is applied to the third conductive semiconductor layer 170, the second conductive semiconductor layer 150, and the active layer 140.

The recesses 160 is formed corresponding to the position of the threading dislocation P1 or the convex patterns 111 of the substrate 110, thereby blocking the current applied to the threading dislocation P1 through the electrode layer 180. Accordingly, the low current characteristic and the ESD characteristic of the light emitting device 100 can be improved, and the light extraction efficiency can be improved by the recess 160.

FIG. 13 is a sectional view showing a semiconductor light emitting device according to a second embodiment. The same reference numerals will be assigned to elements identical to those of the first embodiment, and details thereof will be omitted.

Referring to FIG. 13, a semiconductor light emitting device 100A comprises the substrate 110 having the convex patterns 111, the undoped semiconductor layer 120, the first conductive semiconductor layer 130, the active layer 140, the second conductive semiconductor layer 150, the electrode layer 180, the recesses 160, the first electrode 191, and the second electrode 193.

The electrode layer 180 may be formed on the second conductive semiconductor layer 150, and the recesses 160 may be formed from the electrode layer 180 to the upper portion of the second conductive semiconductor layer 150.

The semiconductor device 100A has a structure in which the second conductive semiconductor layer 150 and the electrode layer 180 are provided on the active layer 140, and the third conductive semiconductor layer 170 is removed. In this case, if the first conductive semiconductor layer 130 is an N-type semiconductor, the second conductive semiconductor 150 layer may be a P-type semiconductor. If the first conductive semiconductor layer 130 is a P-type semiconductor, the second conductive layer 150 may be an N-type semiconductor.

FIG. 14 is a side sectional view showing a semiconductor light emitting device 100B according to a third embodiment. The same reference numerals will be assigned to elements identical to those of the first embodiment, and details thereof will be described in order to avoid redundancy.

Referring to FIG. 14, the semiconductor light emitting device 100B comprises a plurality of recesses 160A having a depth D3 deeper than that of the previous embodiment.

The recesses 160A correspond to the position of the threading dislocation P1, and may be formed to the upper portion of the first conductive semiconductor layer 130. In other words, the recesses 160A extend from the electrode layer 180 to the upper portion of the first conductive semiconductor layer 130 through the third conductive semiconductor layer 170, the second conductive semiconductor layer 150, and the active layer 140. The recesses 160A may have a reverse conical shape or a polyhedral shape.

The semiconductor light emitting device 100B allows a current applied to the first conductive semiconductor layer 130 and the electrode layer 180 to be distributed without being concentrated on the threading dislocation P1 due to the recesses 160A, so that a low current characteristic or an ESD characteristic can be improved.

The recesses 160A and a transmissive insulating layer 167 may be formed to a predetermined depth from the electrode layer 181, the third conductive semiconductor layer 170 or the second conductive semiconductor layer 150, and this may be changed within the technical scope of the embodiment.

FIG. 15 is a side sectional view showing a semiconductor light emitting device 100C according to a fourth embodiment. The same reference numerals will be assigned to elements identical to those of the first embodiment, and details thereof will be described in order to avoid redundancy.

Referring to FIG. 15, the semiconductor light emitting device 100C comprises the recesses 160 having the transmissive insulation layer 167. The insulation layer 167 is filled in the recesses 160, and comprises silicon oxide ($SiO_2$), silicon nitride ($Si_3N_4$), aluminum oxide ($Al_2O_3$), or titanium oxide ($TiO_2$). However, the embodiment is not limited thereto.

Since the insulating layer 167 has an insulation characteristic, a current applied to the electrode layer 180 can be distributed. In addition, the insulating layer 167 may be formed in the recess 160A shown in FIG. 14, but this may be changed within the technical scope of the embodiment.

FIG. 16 is a side sectional view showing a semiconductor light emitting device 100D according to a fifth embodiment. The same reference numerals will be assigned to elements identical to those of the first embodiment, and details thereof will be described in order to avoid redundancy.

Referring to FIG. 16, the semiconductor light emitting device 100D may be realized as a vertical semiconductor light emitting device. The semiconductor light emitting device 100D comprises the substrate 110 (see FIG. 1) on which the undoped semiconductor layer 120, the first conductive semiconductor layer 130, the active layer 140, the second conductive semiconductor layer 150, and the third conductive semiconductor layer 170 are sequentially formed.

An electrode layer 183 is formed on the third conductive semiconductor layer 170, and the recesses 160 are formed to a predetermined depth D4 from the electrode layer 183 corresponding to the threading dislocation P1. The electrode layer 182 may comprise a reflective electrode material such as aluminum (Al), silver (Ag), palladium (Pd), rhodium (Rh), platinum (Pt), or iridium (Ir).

The insulating layer 167 is filled in the plural recesses 160, and comprises one selected from the group consisting of silicon dioxide ($SiO_2$), silicon nitride ($Si_3N_4$), aluminum oxide ($Al_2O_3$), or titanium oxide ($TiO_2$). However, the embodiment is not limited thereto.

A conductive support member 185 is formed on both the electrode layer 183 and the insulating layer 167. The conductive support member 185 may comprise copper (Cu), gold (Au), or a carrier wafer (e.g., Si, Ge, GaAs, ZnO, or SiC). The conductive support member 185 may be formed through an electrolytic plating scheme or may be attached to the electrode layer 183 and the insulating layer 176 through a bonding scheme.

Thereafter, the substrate 110 (see FIG. 1) and the undoped semiconductor layer 120 may be removed through a physical scheme and/or a chemical scheme. The substrate 110 (see FIG. 1) may be physically removed through a laser lift off (LLO) scheme. In addition, the substrate 110 may be chemically removed together with the undoped semiconductor layer 120 (see FIG. 1) by using a wet etching solution, but the embodiment is not limited thereto. The first electrode 191 is formed under the first conductive semiconductor layer 130.

The recesses 160 and the transmissive insulating layer 167 may be formed to a predetermined depth from the electrode layer 183, the third conductive semiconductor layer 170, or the second conductive semiconductor layer 150, and these features may be changed within the technical scope of the embodiment.

The semiconductor light emitting device 100D can distribute a current, which is applied by the conductive support member 185, by the recesses 160, thereby preventing the current from being concentrated onto the threading dislocation P1.

A roughness pattern may be formed under the first conductive semiconductor layer 130, and the roughness pattern can improve light extraction efficiency.

Different from the structure, the semiconductor light emitting device 100D may comprise a transmissive electrode layer (not shown) formed under the first conductive semiconductor 130, and lower recesses (not shown) formed to a predetermined depth from the electrode layer and the first conductive semiconductor layer 130 corresponding to the threading dislocation P1. In addition, the transmissive insulating layer 167 may be formed in the lower recess. The first electrode 191 may be formed under the transmissive electrode layer (not shown).

Meanwhile, the technical characteristics of the first to fifth embodiments are applicable to other embodiments.

Although the embodiment has been made in relation to the compound semiconductor light emitting device comprising the N—P junction structure as an example, the compound semiconductor light emitting device comprising an N—P—N structure, a P—N structure or a P—N—P structure can be implemented.

In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
    a substrate;
    a first conductive semiconductor layer on the substrate;
    an active layer on the first conductive semiconductor layer;
    a second conductive semiconductor layer on the active layer and having a first surface adjacent to the active layer and a second surface opposite to the first surface,
    wherein the second conductive semiconductor layer includes a plurality of recesses disposed on the second surface of the second conductive semiconductor layer;
    an electrode layer on the second conductive semiconductor layer,
    wherein the electrode layer comprises a hole corresponding to the one of the plurality of recesses, the hole being circumscribed by the electrode layer, and
    wherein the plurality of recesses extend toward the first surface without exceeding the first surface of the second conductive semiconductor layer,
    wherein the second conductive semiconductor layer includes a threading dislocation therein, and
    wherein one of the plurality of recesses corresponds to a position of the threading dislocation of the second conductive semiconductor layer.

2. The semiconductor light emitting device of claim 1, further comprising:
    a convex pattern under the first conductive semiconductor layer,
    wherein the convex pattern corresponds to the plurality of recesses.

3. The semiconductor light emitting device of claim 1, further comprising:
    a buffer layer and/or an undoped semiconductor layer interposed between the substrate and the first conductive semiconductor layer,
    wherein the substrate comprises a convex pattern corresponding to the plurality of recesses.

4. The semiconductor light emitting device of claim 1, wherein one of the plurality of recesses has at least one of a polyhedral shape, a reverse conical shape, a polygonal column shape, a cylindrical shape, and a hemispherical shape.

5. The semiconductor light emitting device of claim 1, further comprising:
    a transmissive insulating material in the plurality of recesses of the second conductive semiconductor layer.

6. The semiconductor light emitting device of claim 1, wherein the electrode layer comprises a material selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

7. A semiconductor light emitting device, comprising:
    a substrate comprising a convex pattern;
    a light emitting structure comprising a plurality of compound semiconductor layers on the substrate, the light emitting structure including
        a first conductive semiconductor layer on the substrate;
        an active layer on the first conductive semiconductor layer;
        a second conductive semiconductor layer on the active layer; and
        a third conductive semiconductor layer on the second conductive semiconductor layer;
    an electrode layer on the light emitting structure and having a lower surface adjacent to the light emitting structure and an upper surface opposite to the lower surface; and
    a recess disposed on an upper surface of the electrode layer at a predetermined position corresponding to the convex pattern of the substrate,
    wherein the recess extends from the upper surface of the electrode layer to the light emitting structure toward an upper surface of the active layer without existing within the active layer,
    wherein the recess is circumscribed by the electrode layer and is corresponded to the upper surface of the active layer,
    wherein the second conductive semiconductor layer is interposed between the active layer and the electrode layer,
    wherein the third conductive semiconductor layer is located between the second conductive semiconductor layer and the electrode layer,
    wherein the recess extends to the second conductive semiconductor layer, and
    wherein the first semiconductor layer and the third conductive semiconductor layer are doped with an n-type conductive dopant.

8. The semiconductor light emitting device of claim 7, wherein the convex pattern comprises at least one of a lens shape, a hemispherical shape, a polyhedral shape, and a stripe shape.

9. The semiconductor light emitting device of claim 7, wherein the recess has a maximum width of about 10 nm to about 3000 nm and a depth of about 10 nm to about 1000 nm.

10. The semiconductor light emitting device of claim 7,
  wherein the recess includes a transmissive insulating material therein, and
  wherein a portion of the transmissive insulating material is protruded from an upper surface of the light emitting structure.

11. The semiconductor light emitting device of claim 1, further comprising:
  a transmissive insulating material in the plurality of recesses of the second conductive semiconductor layer,
  wherein an upper surface of the transmissive insulating material is formed of a height higher than a height of the second surface of the second conductive semiconductor layer.

12. The semiconductor light emitting device of claim 1, further comprising:
  a third conductive semiconductor layer on the second conductive semiconductor layer and having a different polarity from the second conductive semiconductor layer,
  wherein the third conductive semiconductor layer comprises a recess corresponding to one of the plurality of recesses of the second conductive semiconductor layer; and
  a transmissive insulating material in the plurality of recesses of the second conductive semiconductor layer,
  wherein an upper surface of transmissive insulating material is formed of a height higher than a height of the second surface of the second conductive semiconductor layer.

* * * * *